United States Patent
Furukawa et al.

(10) Patent No.: US 7,351,666 B2
(45) Date of Patent: Apr. 1, 2008

(54) LAYOUT AND PROCESS TO CONTACT SUB-LITHOGRAPHIC STRUCTURES

(75) Inventors: Toshiharu Furukawa, Essex Junction, VT (US); Mark Charles Hakey, Fairfax, VT (US); Steven J. Holmes, Guilderland, NY (US); David V. Horak, Essex Junction, VT (US); Charles William Koburger, III, Delmar, NY (US); Chung Hon Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 11/378,492

(22) Filed: Mar. 17, 2006

(65) Prior Publication Data

US 2007/0215874 A1    Sep. 20, 2007

(51) Int. Cl.
  *H01L 21/461* (2006.01)
  *H01L 21/302* (2006.01)
(52) U.S. Cl. ............... 438/736; 438/694; 438/717; 257/48; 257/E21.038; 257/E21.039; 257/E21.314
(58) Field of Classification Search ........... 438/717, 438/736, 694; 257/48, E21.038, E21.039, 257/E21.314
See application file for complete search history.

(56) References Cited

U.S. PATENT DOCUMENTS

| 6,767,693 | B1 * | 7/2004 | Okoroanyanwu | 430/311 |
| 6,875,703 | B1 | 4/2005 | Furukawa et al. | |
| 2004/0211953 | A1 * | 10/2004 | Khouri et al. | 257/2 |
| 2006/0189045 | A1 * | 8/2006 | Shum et al. | 438/148 |

* cited by examiner

*Primary Examiner*—Michael Lebentritt
*Assistant Examiner*—Mohsen Ahmadi
(74) *Attorney, Agent, or Firm*—Keusey, Tutunjian & Bitetto, P.C.; Mark Wardas

(57) ABSTRACT

An integrated circuit and method for fabrication includes first and second structures, each including a set of sub-lithographic lines, and contact landing segments connected to at least one of the sub-lithographic lines at an end portion. The first and second structures are nested such that the sub-lithographic lines are disposed in a parallel manner within a width, and the contact landing segments of the first structure are disposed on an opposite side of a length of the sub-lithographic lines relative to the contact landing segments of the second structure. The contact landing segments for the first and second structures are included within the width dimension, wherein the width includes a dimension four times a minimum feature size achievable by lithography.

13 Claims, 15 Drawing Sheets

LAYOUT AND PROCESS TO CONTACT SUB-LITHOGRAPHIC STRUCTURES

BACKGROUND

1. Technical Field

The present invention relates to semiconductor fabrication and more particularly to methods and devices for applying contacts to sub-lithographic features in integrated circuits.

2. Description of the Related Art

As optical lithography approaches the end of its extendibility, other options have been proposed for defining increasingly-small features. Sidewall Image Transfer (SIT) has been set forth as one method for making sub-lithographic features. SIT utilizes spacers on lithographically-printed "mandrels" as image-defining shapes. Since two spacers are available for each lithographically-defined image (one on each side), SIT in its simplest form, "frequency doubles" what would be achievable employing the lithography to fabricate mandrel patterns.

One problem with "useful-width" sub-lithographic patterns, however, is that it is difficult to make contact to them. Individual contacts need to be printed using the best-available lithography. The minimum size printable with a lithography generation is "F", which is presumably the same dimension as employed for mandrel printing.

With frequency-doubled (standard) SIT at minimum pitch, a (1F) contact is landed on a line that is (approximately) F/2 having only F/2 spaces to adjacent lines. Landing a contact on anything smaller is extremely difficult.

The usefulness of SIT is limited if connections between improved-pitch lines and surrounding circuits cannot be made. Though, for arrays of lines such as for memory arrays, where long connections are possible, the improved pitch may be valuable for the "array" even when support areas are defined using standard lithography.

SUMMARY

Note that for spacer-based image-creation processes in accordance with this disclosure, self-enclosed loops of a single width may be provided. "Loop cutter" masks are thus added to chop the continuous loops into individual segments, and another ("wide-area") mask is used to define images having widths other than the (single) spacer-thickness.

A layout in accordance with embodiments described herein includes alternate ends of deep-sub-lithographic line-groups that can be employed to provide necessary lithographically-limited contact space. These structures replace chains of lithography-limited contacts which were arranged perpendicular to the length dimension of the contacted deep-sub-lithographic lines (e.g., no room for such an arrangement) with lines of lithography-limited contacts in lines parallel to a length dimension of the lines.

An integrated circuit and method for fabrication includes first and second structures, each including a set of sub-lithographic lines, and contact landings connected to at least one of the sub-lithographic lines at an end portion. The first and second structures are nested such that the sub-lithographic lines are disposed in a parallel manner within a width dimension, and the contact landings of the first structure are disposed on an opposite side of a length of the sub-lithographic lines relative to the contact landings of the second structure. The contact landings for the first and second structures are included within the width dimension.

An integrated circuit and method for fabrication includes first and second structures, each including a set of sub-lithographic lines, and contact landing segments connected to at least one of the sub-lithographic lines at an end portion. The first and second structures are nested such that the sub-lithographic lines are disposed in a parallel manner within a width, and the contact landing segments of the first structure are disposed on an opposite side of a length of the sub-lithographic lines relative to the contact landing segments of the second structure. The contact landing segments for the first and second structures are included within the width dimension, wherein the width dimension includes a dimension four times a minimum feature size achievable by lithography.

An integrated circuit includes first and second structures, each structure including: a set of sub-lithographic lines, for which a sum of a width of the sub-lithographic line and a width of adjacent sub-lithographic space is less than or equal to about a quarter a minimum pitch achievable by lithography; and contact landing segments are connected to at least one of the sub-lithographic lines at an end portion. The first and second structures are nested such that the sub-lithographic lines are disposed in a parallel manner within a width dimension and the contact landing segments of the first structure are disposed on an opposite side of a length of the sub-lithographic lines relative to the contact landing segments of the second structure and the contact landing segments for the first and second structures being included within the width dimension. The width dimension includes a dimension of at least four times a minimum feature size achievable by lithography.

A method for fabricating integrated circuits includes forming a mandrel mask pattern including a first structure and a second structure. Each structure includes a line portion and a wider ("flag") portion. The first and second structures are arranged on a first layer such that the line portions are adjacent and run parallel to each other, and the flag portions of the first and second structures are oppositely disposed and overlap an end of the line portion of the other structure. The mandrel mask pattern is transferred to the first layer, and spacers are formed on the transferred mandrel mask pattern. Then, the mandrel mask pattern is removed from between the spacers. Mask structures may be formed to augment the spacers to increase a dimension of the spacers. These steps of transferring the mandrel mask pattern, forming spacers, removing the mandrel pattern from between the spacers and forming mask structures may be repeated until a number and size of sub-lithographic conductive lines and contact landings are formed.

Masked spacer etching (e.g., using mask structures) may be employed while forming SIT mandrels to spread or augment secondary (frequency-multiplication) spacers. Polishing, such as CMP, may be employed to remove "erroneous" spacer material from atop mandrels after the masked-spacer etch, to permit mask structures to straddle the deep-sub-lithographic space between spacers.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
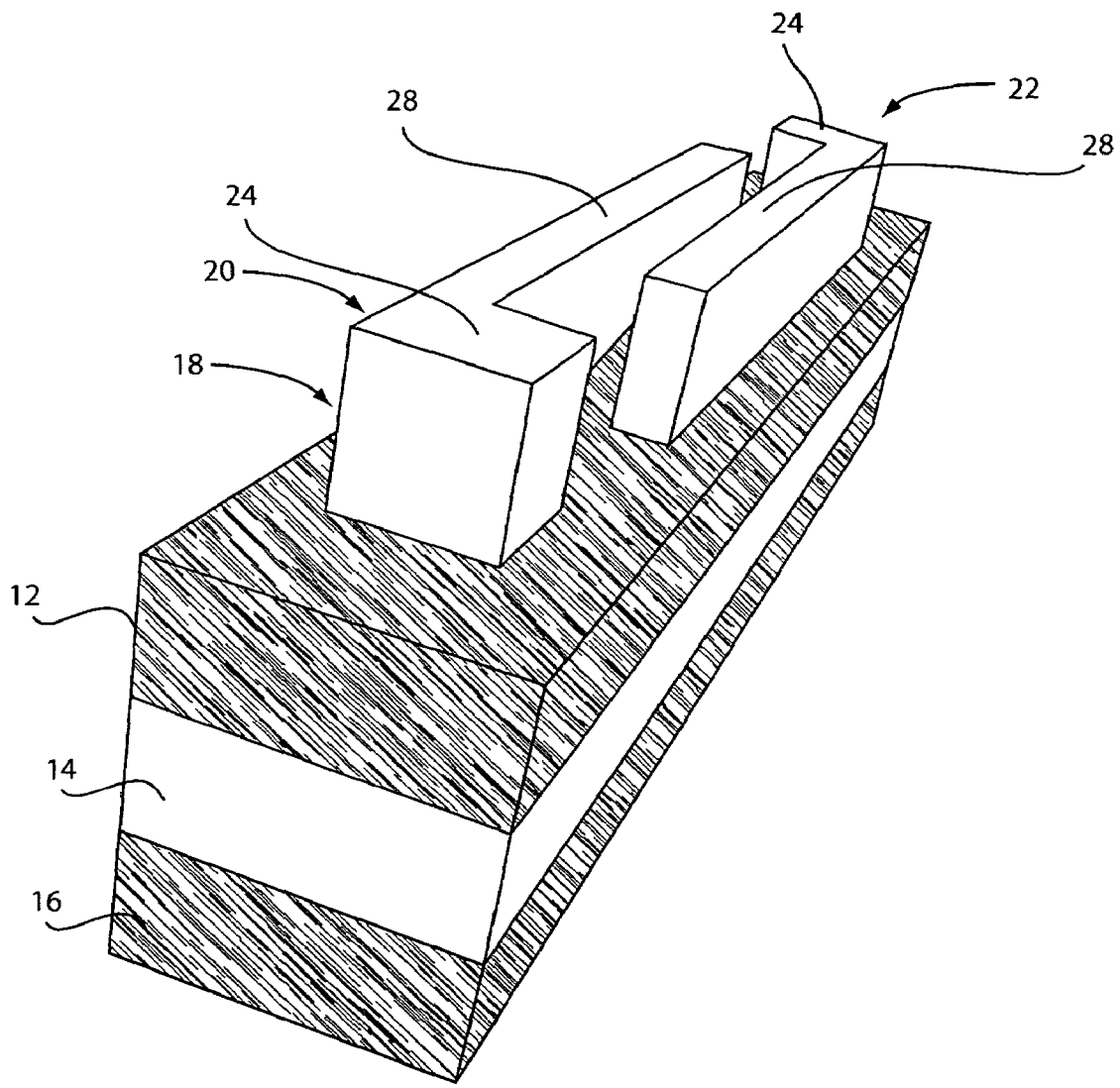
FIG. 1 is a perspective view of a layer stack having a mandrel pattern formed on a first layer.

Embodiments described herein provide devices, structures and fabrication methods, which provide contacts or connections to sub-lithographic conductors. To make contacts of minimum feature size, F, to groups of sub-lithographic parallel lines, (e.g., SIT-based "frequency-multiplied" lines), the sub-lithographic lines need to be spread out in such a manner that does not degrade the improved pitch defined using SIT. The improved pitch preferably includes a minimum pitch, which is the distance between a same feature in a periodic pattern providing a minimum needed space for proper function. SIT processing is described in U.S. Pat. No. 6,875,703, incorporated herein by reference.

To accomplish this expansion, contacts can be moved to the ends of the parallel lines, and line groups can be interleaved so that a group's contacts can take advantage of area at the end of adjacent groups. In addition, a "flag" (widened area) can be designed into a part of mandrels extending into the available space beyond the end of an opposite unit in the interleave. The "height" of the "flag" (in the direction of the line lengths) preferably should be sufficient to provide a necessary separation between sidewalls to enable 1F-sized contact.

During each "frequency multiplication" process, a "horizontal" section of the spacer flag includes widened legs to maintain separation between subsequent horizontal legs of the image-spacers on the mandrels. This widening uses one added mask for each "multiplication". The final (SIT) image-spacer may then be segmented, using a single "loop cutter", before transferring that spacer's pattern into the final film/structure.

For F/8 line/space pairs, more space is needed, and the "flag" on the ends needs to be wrapped around two 1F-by-1F mandrels (e.g., mates). Further description follows.

Embodiments of the present invention can take the form of a semiconductor device or integrated circuit. The device/circuit as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities as perform such fabrication, directly or indirectly.

The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods described herein are preferably employed in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, an illustrative device 10 is shown having a first layer 12 of conductive or semiconductive material, a second (dielectric) layer 14 and a third layer 16 of conductive or semiconductive material. The first layer 12 and the third layer 16 may include polysilicon, metal, silicon or any other material. Third layer 16 preferably includes a conductive material since contacts will be connected or landed on fabricated features from this third layer 16.

It is noted that layer 16 is formed on or over a substrate (not shown) or preceding layers. Layer 16 may be any layer within an integrated circuit design that needs landings for contacts to sub-lithographic features. This may include the case where layer 16 is a substrate, such as a monocrystalline substrate or the like.

Dielectric layer 14 may include a nitride, such as a silicon nitride. Other dielectric materials may also be employed for layer 14, such as oxide (a silicon oxide). It is to be understood that the layers of materials selected throughout the process as described herein will be based upon the ability to selectively etch and mask structures. One skilled in the art understands how to select materials to perform the etching processes as described herein.

A resist layer 18 is patterned using lithographic techniques. A pair of starting resist shapes 20 and 22 are illustratively shown as part of the patterned resist layer 18. Each resist shape 20 and 22 will define a mandrel with which to begin SIT processing. Shapes 20 and 22 are shown nested (fitting into one another head to tail). Arrays of such shapes 20 and 22 may be assembled by stacking groups of these shapes horizontally along the surface of the device 10.

It is to be noted that other shapes and configurations may be simultaneously processed during the fabrication process. In addition, areas of the device 10 may be masked off for processing at a later time. For example, in a memory chip, the logic section and the array section may be processed alternately by masking one section during the processing of the other.

Shapes 20 and 22 are illustrative of one embodiment and configuration. The length of the long narrow portion of shapes 20 and 22 may vary depending on the length of the desired "array" portion or other processed features. Each shape 20 or 22 includes a flag region 24. Contact will be individually made to each sub-lithographic SIT-based line in each flag region 24 at the end of the arrays, where the flag region 24 may be only 2, 3 or 4 times F (or dimensions in between) (F is one lithographic unit) wide, and the SIT lines to be formed may each be about ¼×F wide with about ¼×F space. The dimensions given herein are approximate, and those skilled in the art would understand that tolerances and process variations may affect these dimensions.

By having the flag region 24 overlap beyond the end of each line 28 for that line's end, a 4×F wide space is provided rather than only 2×F. The 4×F wide space includes the width of shapes 20 and 22, the space in between the shapes 20 and 22 and the space needed outside the shapes 20 and 22 (e.g., space between shapes 20 and 22 and other features on the chip/device). Since the contacts in this embodiment will remain 1F×1F, the contacts will be fit in the flag region 24. This will become clear from the following description.

Figure 2:
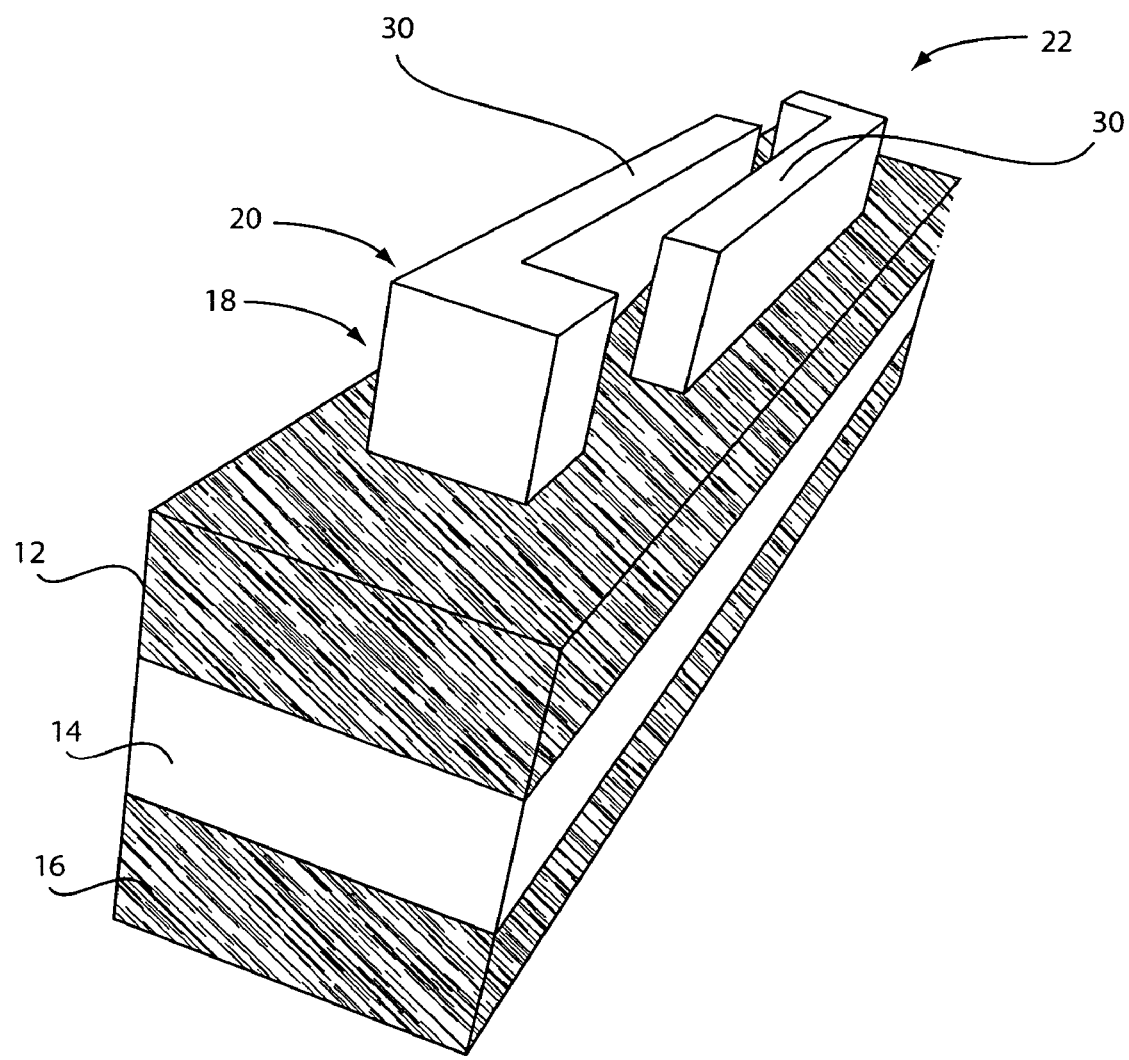
FIG. 2 is a perspective view of the layer stack having the mandrel pattern trimmed to narrow the mandrel mask formed on the first layer.

Referring to FIG. 2, shapes 20 and 22 may be referred to as mandrel resist shapes 30 and will be employed to define sidewall spacer patterns. These sidewall spacers, after being further processed, will in turn be employed as an etch mask for sub-lithographic features to be formed in layer 14. The mandrel resist shapes 30 may be processed to shrink their size or otherwise trim portions of shapes 20 and 22. For example, resist shapes 30 may be reduced from 1×F wide to ¾×F wide. This reduction may be performed by an etching process, e.g., an oxygen ash process. This step is optional and serves the purpose of providing for equal line/space SIT shapes which will be formed later. Without this equalization of line and space, the maximum-allowable single dimension of the SIT-defined final image can decrease. FIG. 2 shows resist shapes 20, 22 slightly reduced in size compared to those of FIG. 1.

Figure 3:
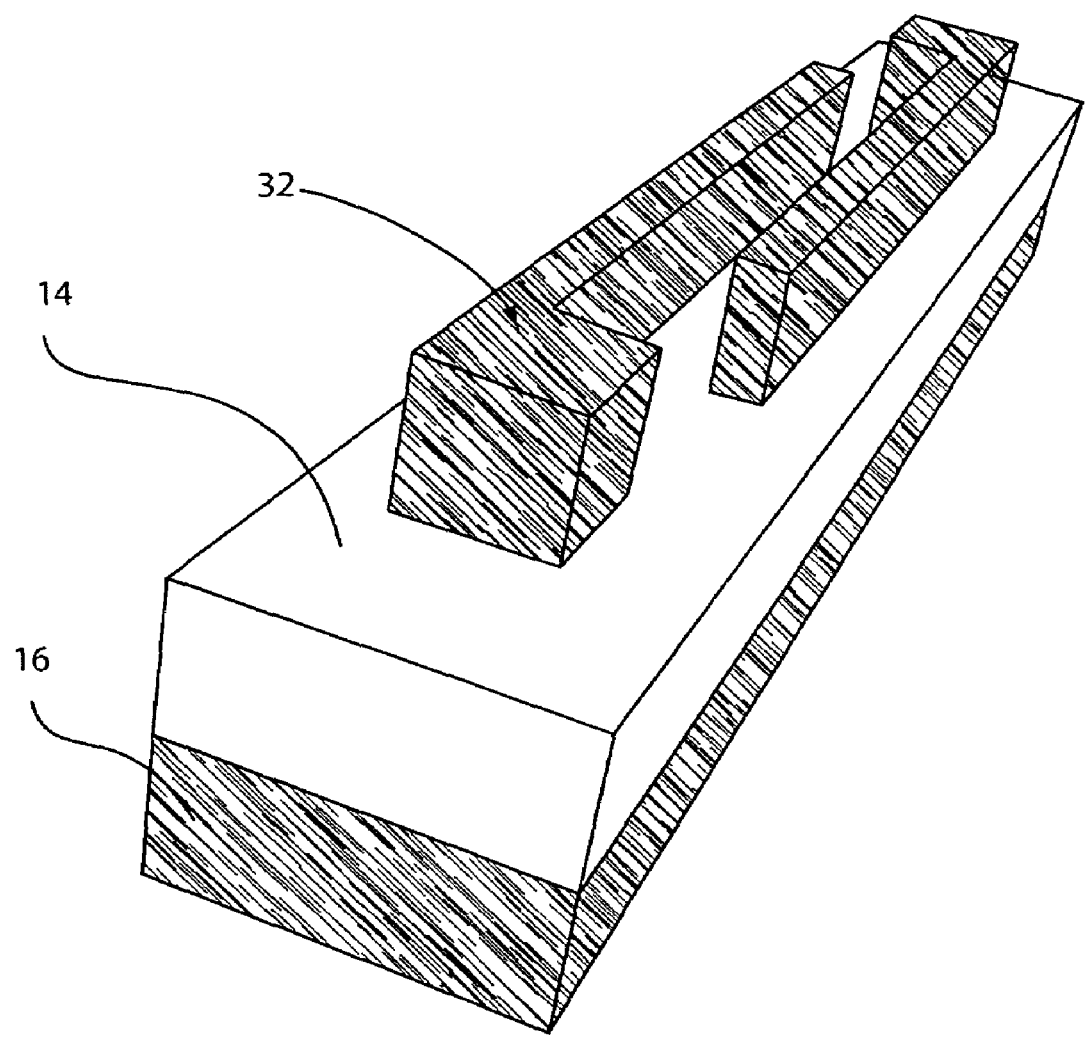
FIG. 3 is a perspective view of the layer stack after the mandrel pattern has been transferred to the first layer.

Referring to FIG. 3, the (shrunken) mandrel resist pattern of FIG. 2 is transferred by etching into layer 12 which is, for example, polysilicon. The etch may include an anisotropic etch such as a reactive ion etch that stops on layer 14. A pattern of resist shapes 30 is transferred to layer 12, forming a mandrel 32. The resist layer 18 (FIG. 2) is then removed or stripped from layer 12.

Figure 4:
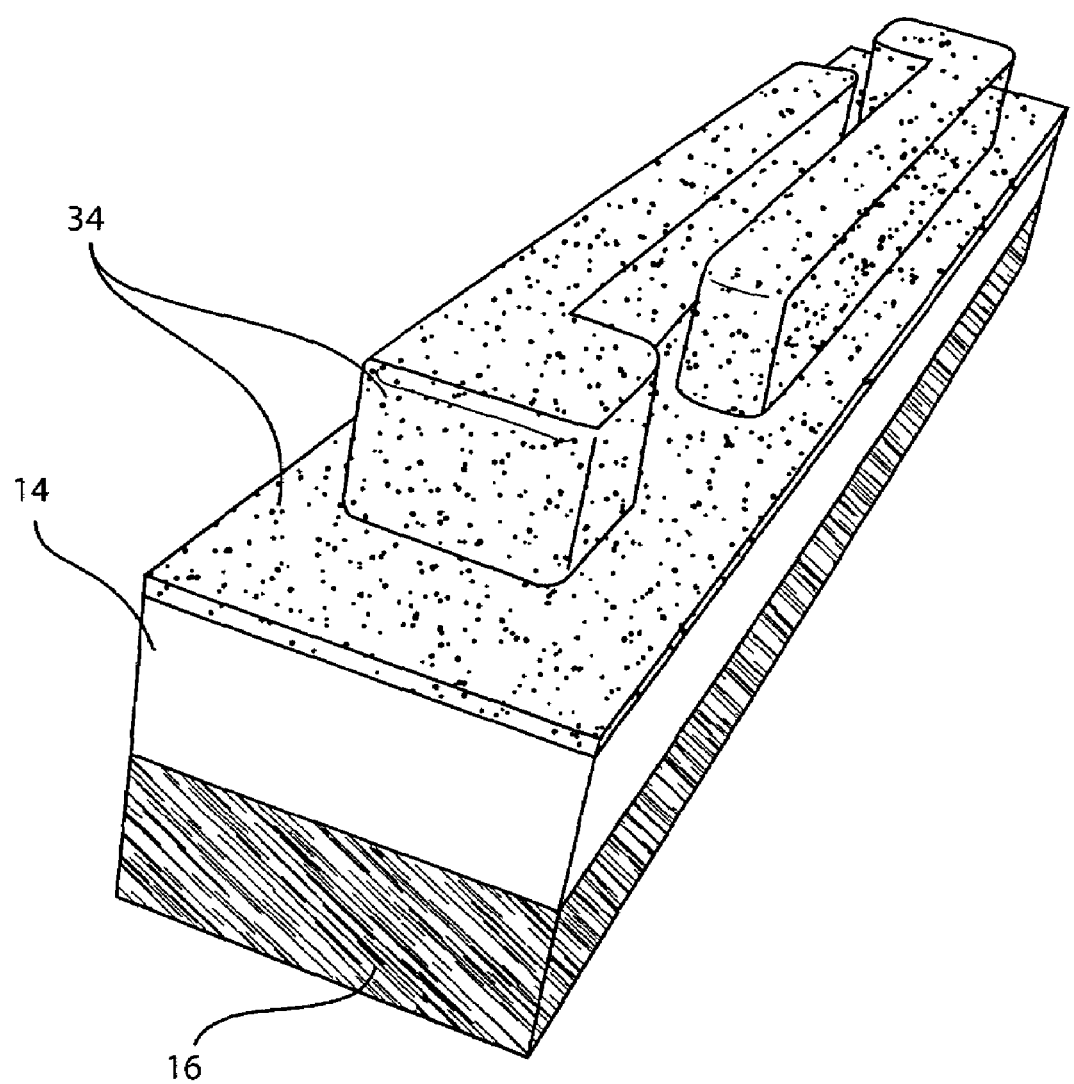
FIG. 4 is a perspective view showing a spacer layer formed on the mandrel pattern which is formed in the first layer.

Referring to FIG. 4, a spacer layer 34 is deposited over the mandrel 32 and layer 14. Spacer layer 34 preferably includes a dielectric layer, such as a nitride or oxide. Spacer layer 34 may be of a thickness of about ¼×F. The thickness is chosen to produce equal line/space SIT structures. Layer 34 will form a second mandrel in the SIT process.

Figure 5:
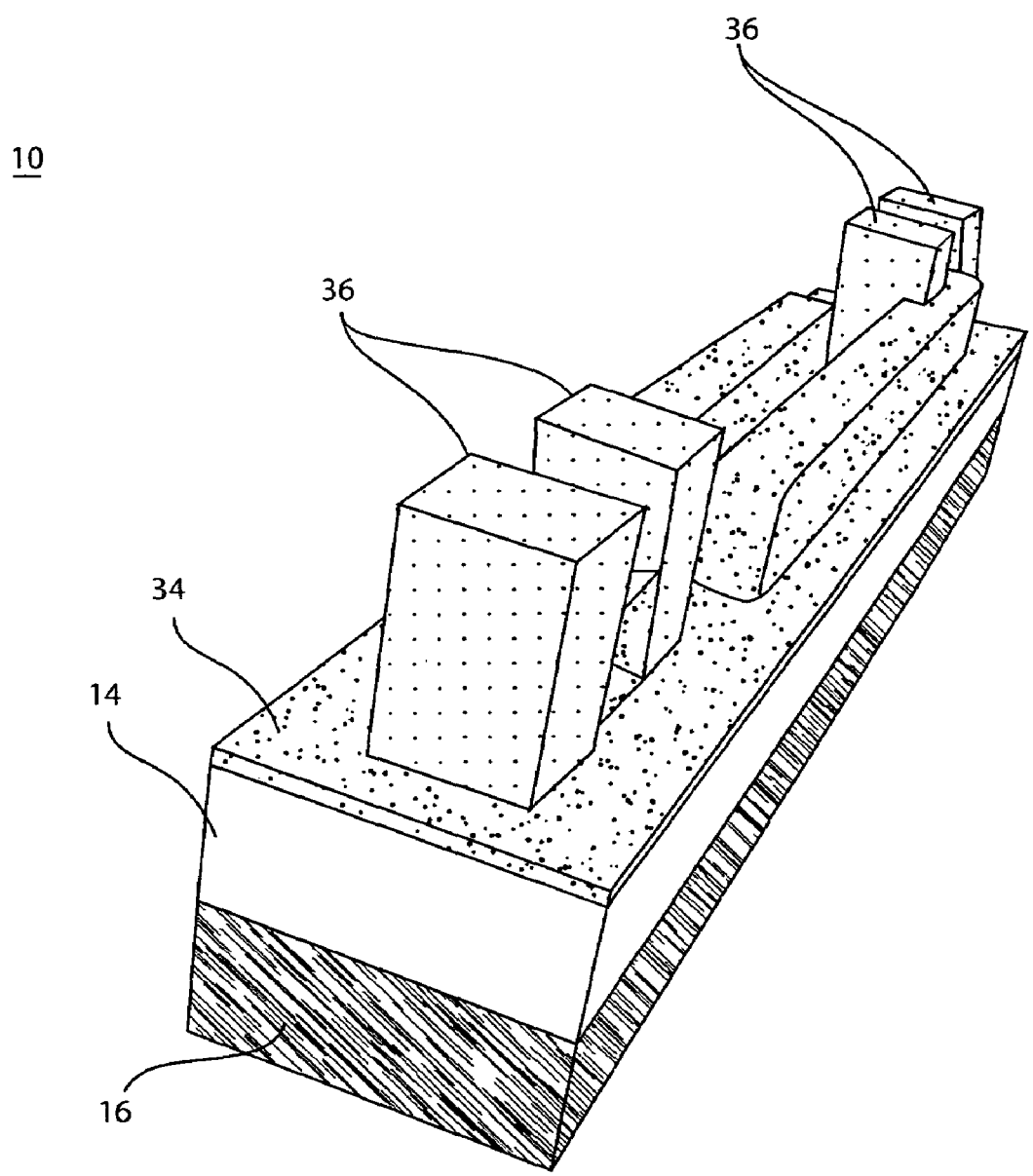
FIG. 5 is a perspective view showing spacer-masks or mask structures formed on the spacer layer to optionally augment the spacers.

Referring to FIG. 5, a layer of photoresist is deposited and patterned (printed) to form mask structures 36. Mask structures 36 are provided to widen the second mandrel to be formed from spacer layer 34. Without these mask structures 36, it would be difficult to separate pairs of sub-lithographic lines to separately contact the lines. Applying wide-area mask structures 36 to widen intermediate mandrels has been provided for the first time herein.

Figures 6, 6A:
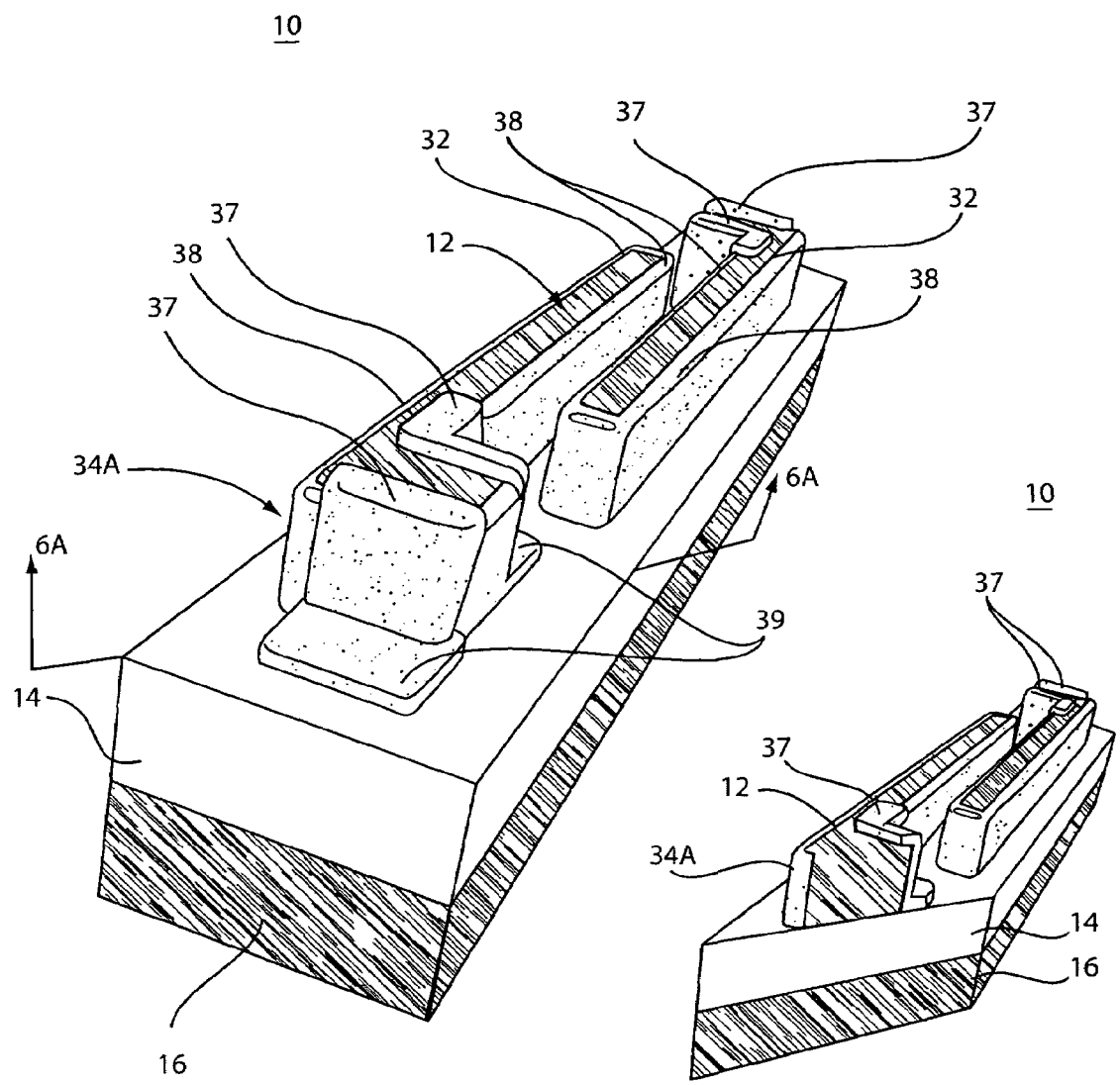
FIG. 6 is a perspective view showing the etching of the spacer layer (and the mask structures) to expose the mandrel pattern formed in the first layer.
FIG. 6A is a perspective view showing a cross-section taken at section line 6A-6A of FIG. 6.

Referring to FIG. 6, with mask structures 36 in place, the spacer layer 34 is anisotropically etched, selective to layer 14, preferably with a reactive ion etch, leaving spacers 34A. The etch stops on layer 14 as did the previous etch. Remaining portions of mask structures 36 are removed. FIG. 6 shows the post-etch structure with mask structures 36 removed. Material selection and etch selectivity between layers 14 and 34 can be chosen as known in the art to provide the results shown in FIG. 6.

The post-etch structure includes ¼×F lines 38, and pads 39 which straddle the mandrel 32. Pads 39 include "high" and "low" regions (some on top and some on bottom of the mandrel). FIG. 6A shows a cross-sectional view taken at section line 6A-6A in FIG. 6. FIG. 6A shows high regions 37 where material from spacer layer 34 is atop mandrel 32 at positions where etching of spacer layer 34 was masked by mask structure 36 (FIG. 5).

Figure 7:
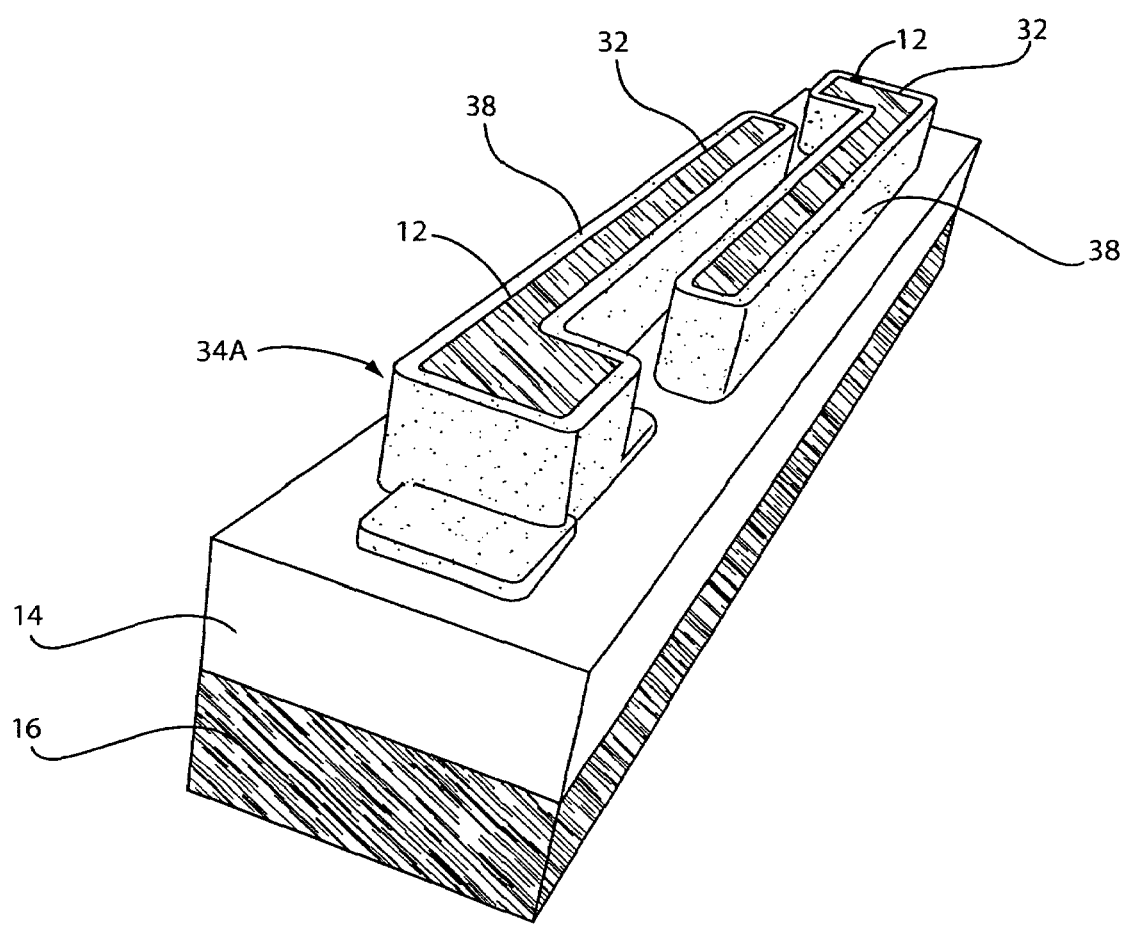
FIG. 7 is a perspective view showing polishing of the top of the mandrel pattern to remove portions of spacer layer and mask structures.

Referring to FIG. 7, a polishing process is performed to remove the "high" regions (37) of layer 34 from the top of the mandrels 32. The polish process may include a chemical-mechanical polishing (CMP) process. The CMP process permits printing a much larger pad for landing a contact(s). In addition, the landing pad that will be provided is less sensitive to overlay issues due to its size, and guarantees that the space where the mandrel 32 was remains clear.

Figure 8:
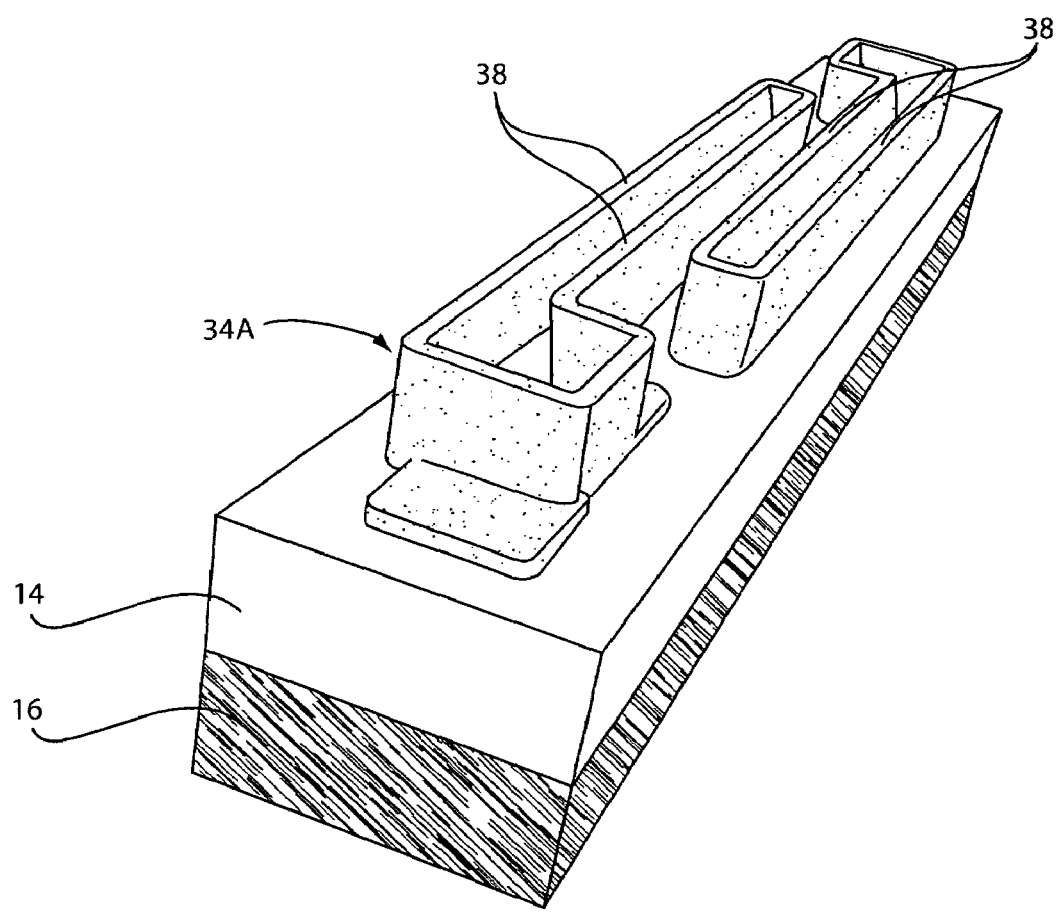
FIG. 8 is a perspective view showing the removal of the mandrel pattern formed in the first layer.

Referring to FIG. 8, mandrel(s) 32 are then removed or stripped, stopping on the underlying layer 14 without eroding layer 14 or patterned spacer 34A. Mandrels 32 which are formed from layer 12 may be removed by a wet (or dry) etching process.

Figure 9:
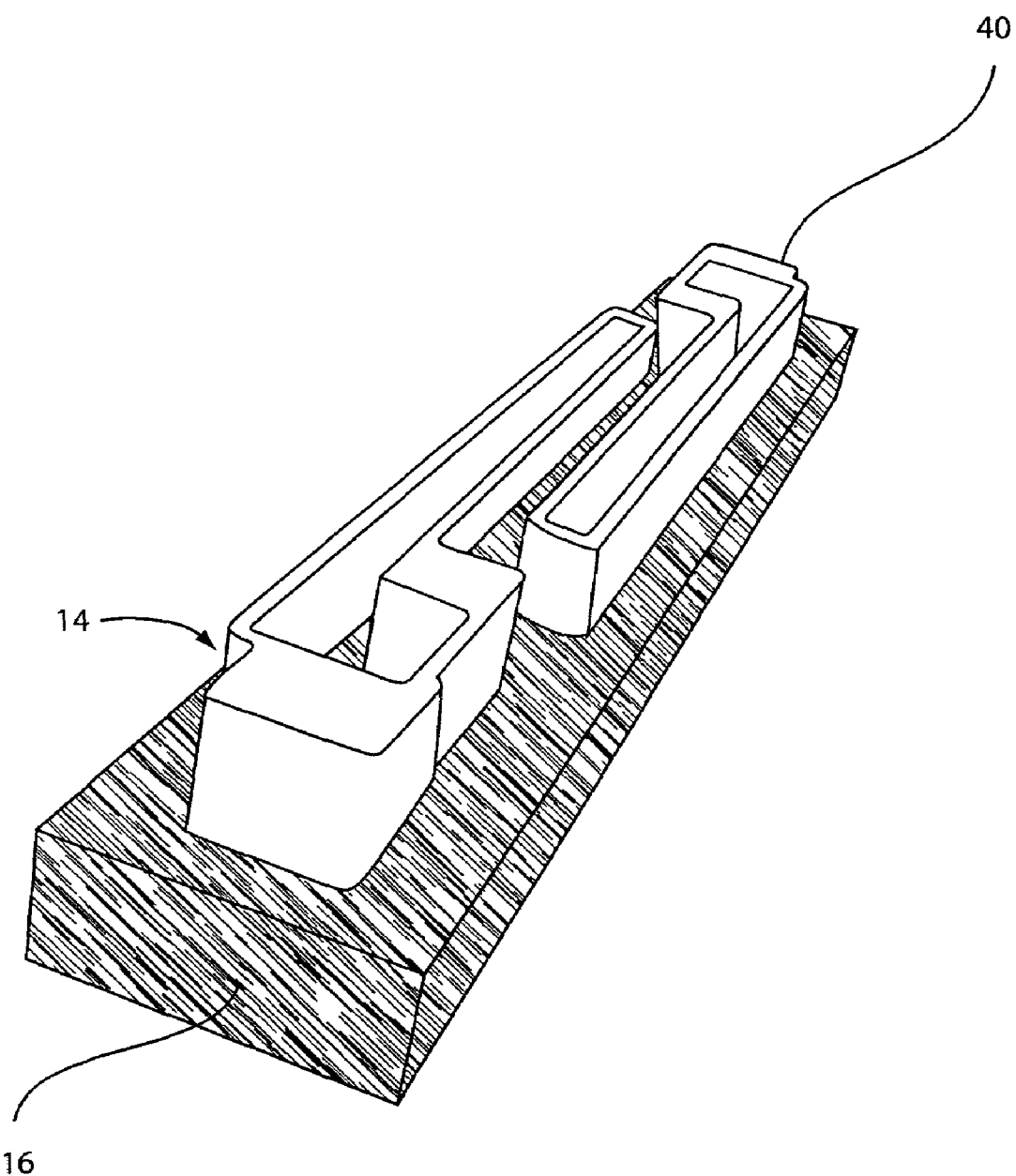
FIG. 9 is a perspective view showing the etching of a second layer using the spacer layer augmented by the mask structures to transfer the spacer pattern to the second layer to form a second mandrel in the second layer.

Referring to FIG. 9, a transfer etch transfers the patterned spacer 34A into layer 14. This etch permits the formation of a thick uniform final mandrel 40 in layer 14. The etching process may include a reactive ion etch using the patterned spacer 34A as a mask. After the etch, any remaining portions of the patterned spacer 34A are stripped away. Layer 16 is the final film that will be patterned in subsequent steps.

Figure 10:
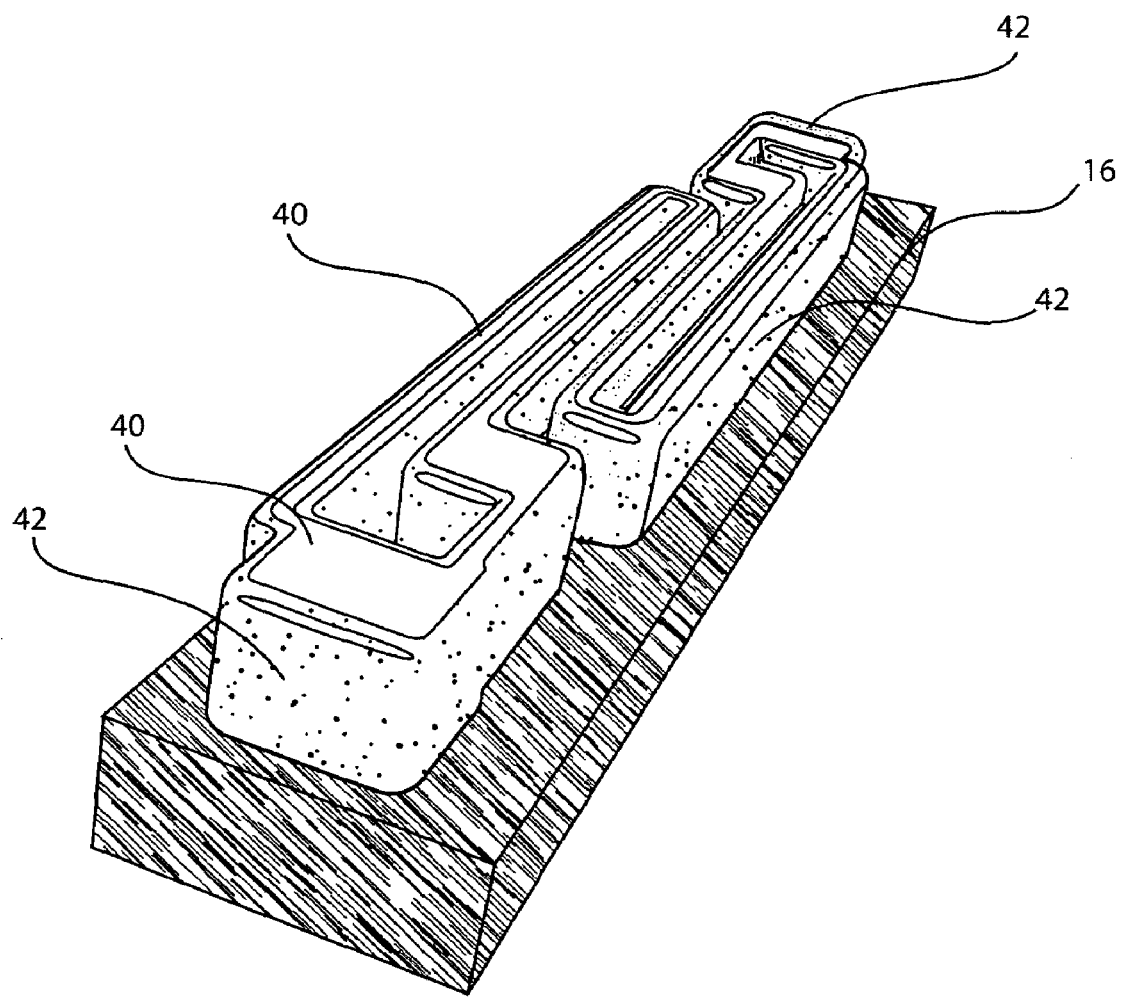
FIG. 10 is a perspective view showing a second spacer layer formed on the second mandrel pattern after an unmasked etch to expose the second mandrel pattern.

Referring to FIG. 10, a second spacer film (not depicted until after etch) is deposited (e.g., nitride or oxide) having ¼×F thickness. This second spacer film (forming spacers 42) will overlay the final mandrel 40 (FIG. 9). Second spacer film is formed and then subjected to an unmasked reactive ion etch to remove the second spacer film 42 from areas other than against final mandrel 40. Second spacers 42 are so formed. The post-etch configuration is shown in FIG. 10.

Figure 11:
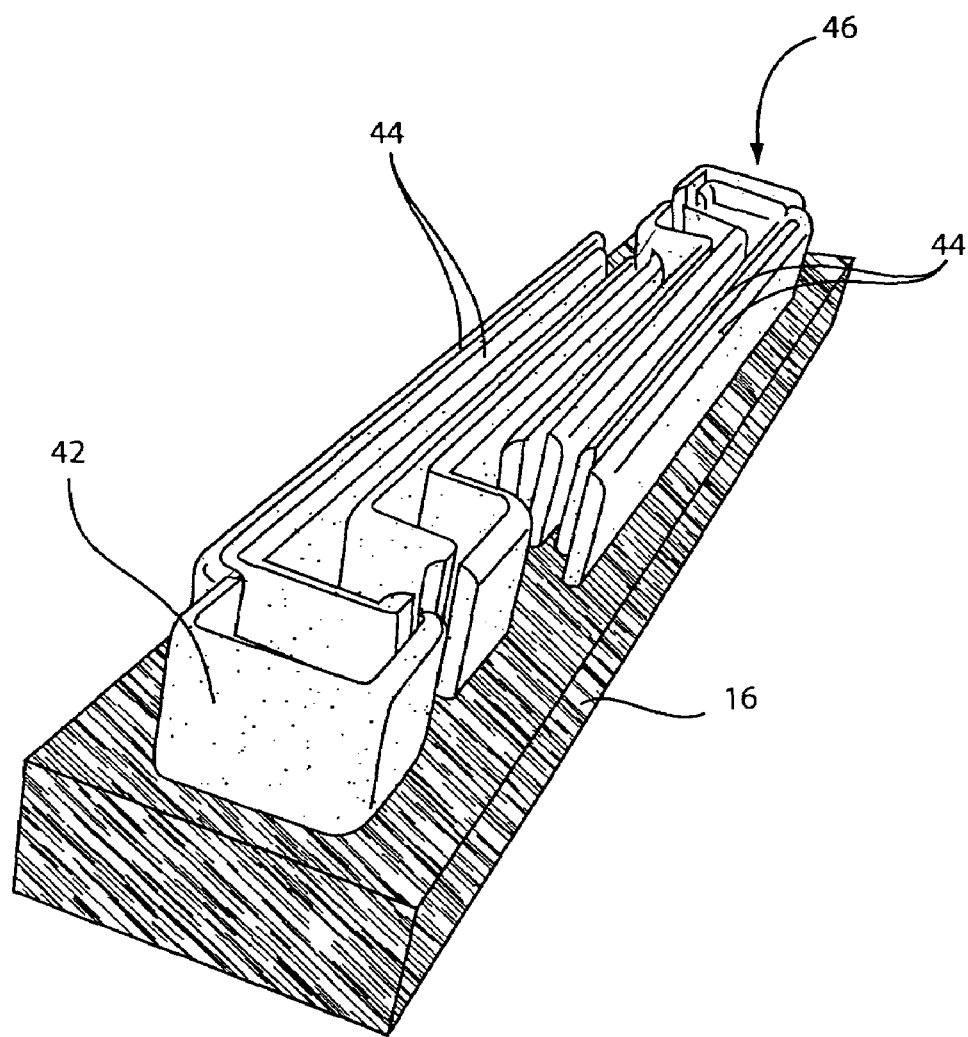
FIG. 11 is a perspective view showing the removal of the second mandrel pattern formed in the second layer.

Referring to FIG. 11, an etch is performed, e.g., a wet or dry etch, to remove final mandrel 40 (FIG. 10) from between second spacers 42. The etch produces a final pattern or mask structure 46 formed of the second spacers 42 that includes lines 44 of about ¼F in size, which will be transferred into the underlying layer 16. It is contemplated that any sized line, preferable less than F, may be provided (as long as they are sufficiently narrow to not touch (short) across the space between adjacent shapes of final mandrel 40 (e.g., provide a minimum pitch). Lines narrower than ¼F may be made by repeating the steps outlined above to achieve the correct spacing, pitch and line width. It is to be understood that the lines may be any dimension based upon the selection of materials thicknesses and etching properties.

Wide-area masks (similar to mask structure 36 in FIG. 5) may be included to enhance the mask pattern shown in FIG. 11. Prior to etching layer 16, mask structures may be formed if it is desired to have final-film patterns having widths other than F/4, to increase the size of portions of the mask structure 46, or create connections between structures. Other mask-and-etch processes may also be employed to cut SIT-like loops into discrete segments or form breaks between conductive structures.

Figure 12:
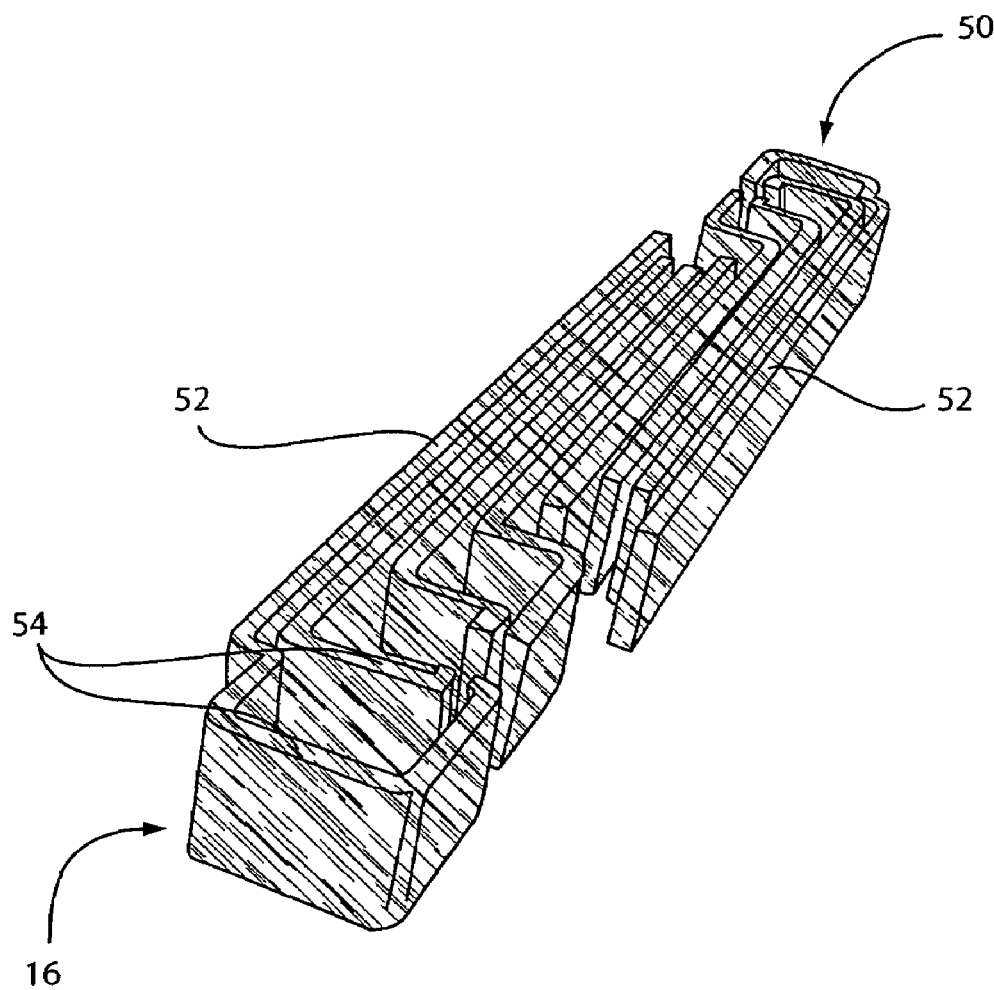
FIG. 12 is a perspective view showing the etching of a third layer using the second spacer layer (which may be augmented by mask structures) to transfer the spacer pattern to the third layer.
Figure 13:
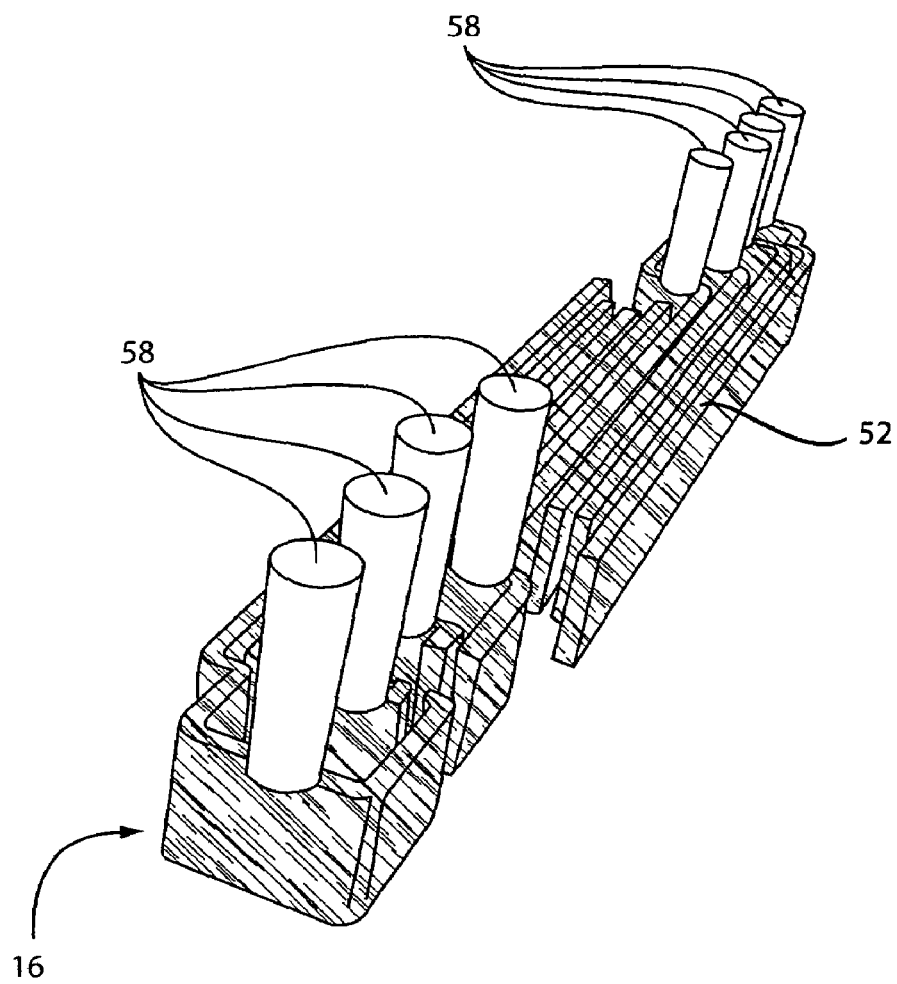
FIG. 13 is a perspective view showing lithographic sized contacts landing on contact landings formed in the third layer.

Referring to FIG. 12, a reactive ion etch is employed to transfer the pattern of mask structure 46 (FIG. 11) into layer 16. Layer 16 is now patterned to form conductive lines 52 and contact segments 54. In one embodiment, a set of sub-lithographic lines, for which a sum of a width of the sub-lithographic line and a width of adjacent sub-lithographic space is less than or equal to about a quarter minimum pitch achievable by lithography. Advantageously, the lines 52 include a sub-lithographic dimension (e.g., F/4) and the contact segments 54 permit 1F×1F contacts to land and connect to the sub-lithographic conductive lines 52. The entire structure 50 (and needed spacings) preferably fits into a width dimension of 4F, although the width dimension of the structure 50 (with needed spacings) may be smaller. This includes needed spacing between features (e.g., between and adjacent to lines 52, etc.). 1F×1F contacts 58 can be placed as shown in FIG. 13, intersecting one (and only one) of the F/4 lines and permitting sufficient distance to prevent shorts between lines 52 due to contacts 58. Note that passivation films have been omitted in FIG. 13 to permit viewing of contacts landing on flag portions of segments 54 (FIG. 12) of lines 52.

Figures 14A, 14B:
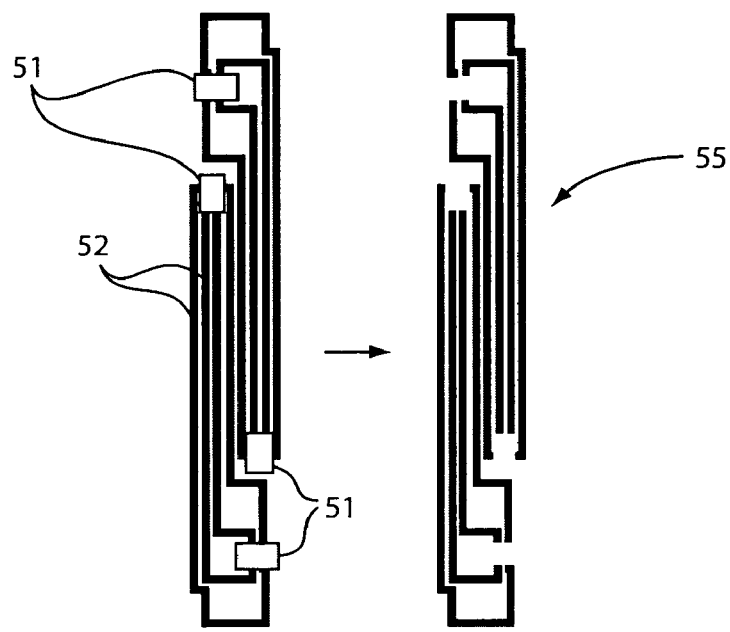
FIG. 14A is a top view demonstrating a loop cutter mask for severing sub-lithographic lines.
FIG. 14B is a top view showing conductive lines after etching with the mask for severing sub-lithographic lines.

Referring to FIGS. 14A and 14B, a loop cutting mask is employed to cut SIT loops created employing the above embodiments into discrete segments, and to break conductive lines as needed. In FIG. 14A, regions 51 are shown where breaks are needed between conductive lines 52 or portions of conductive lines 52. To perform this loop cutting, material in regions 51 is removed from the mask pattern used to etch the conductive layer which formed the conductive lines 52 (FIG. 14A shows an inverse pattern for easier understanding). An etch is performed using the modified etch mask to provide the lines in their desired segmented form. The loop cuter mask is then removed. The resultant conductive structure 55 is shown in FIG. 14B.

Figure 15:
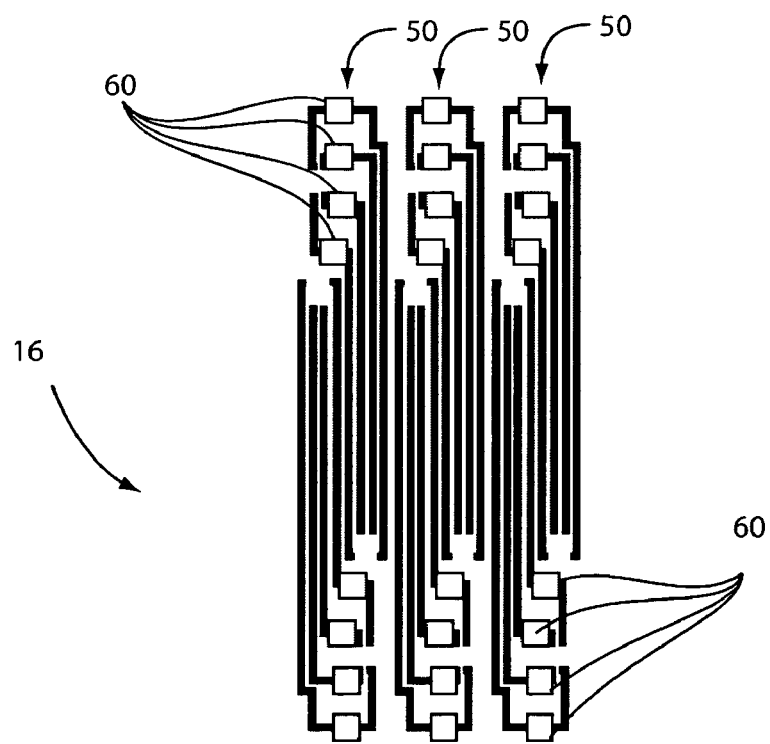
FIG. 15 is a top view showing nested structures having contact regions along the length of signal lines to conserve space.

Referring to FIG. 15, a top view of the patterned conductive layer 16 is illustratively shown having three structures 50 side-by-side. In FIG. 15, landings 60 are formed by a process sequence to provide larger landings than segments 54 in FIG. 12. Wide-area resist features (not shown) may be printed and used in conjunction with the mask structure 46 of FIG. 11 and etched into layer 16 to permit the formation of contacts landings 60. Contacts would land (mostly) on the contact landings 60.

Figure 16:
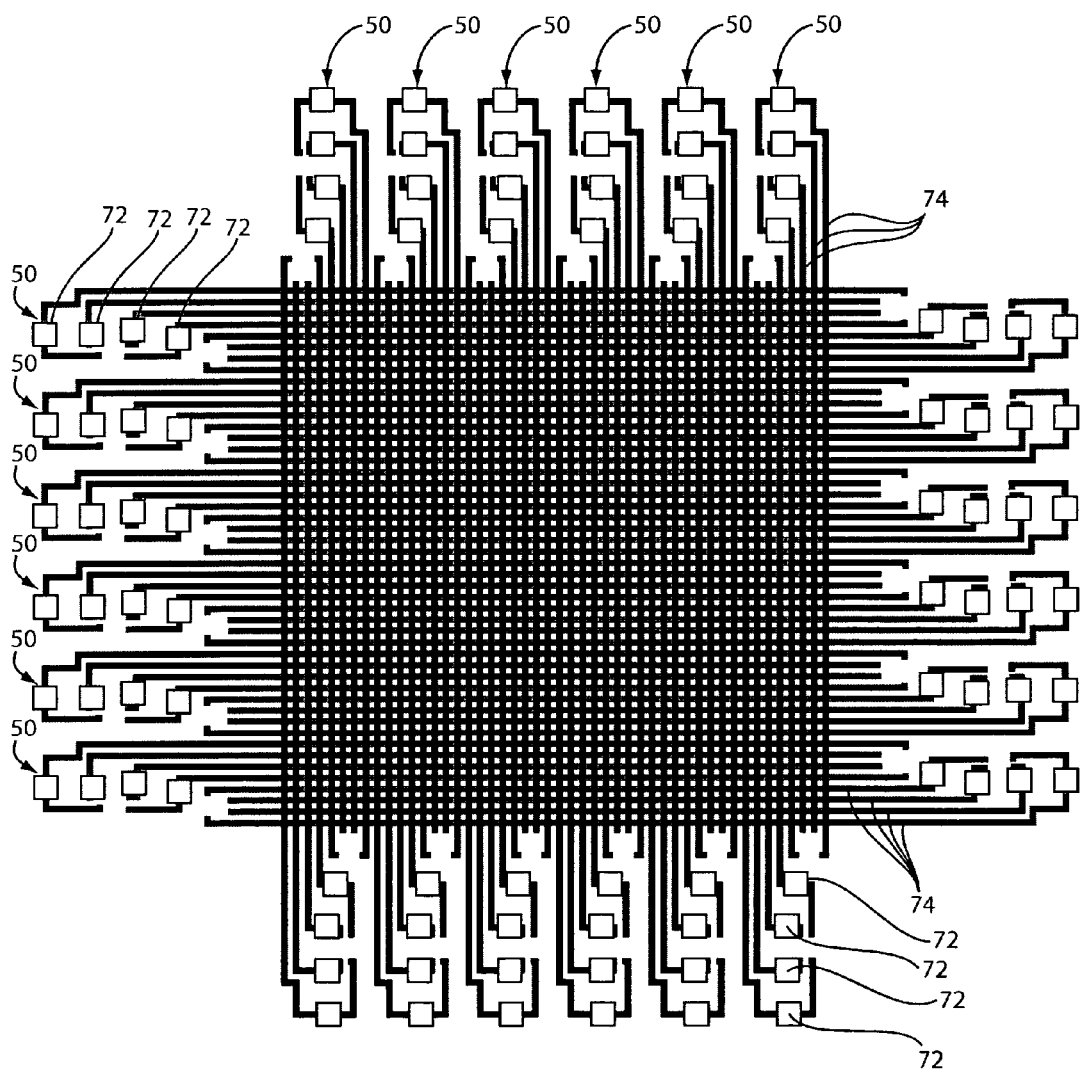
FIG. 16 is a top view of an illustrative array for a memory device, which employs the nested structures to conserve space.

Referring to FIG. 16, a (12×4)×(12×4) cross-point memory array 70 is illustratively shown with contacts 72 to quad-pitch lines 74. Horizontal lines indicate bitlines (or wordlines), and vertical lines represent word lines (or bit-lines). Horizontal lines and vertical lines are placed on different layers in the device 70. The 2,304 cross-point cells formed between the horizontal and vertical lines take up 576 $F^2$ (plus contact and support area) (each cell occupies only about ¼$F^2$). These cells are currently too small to be programmed using photo printing (e.g., contact versus no contact); instead the cells should be programmed electronically.

Having described preferred embodiments of a layout and process to contact sub-lithographic structures (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for fabricating integrated circuits, comprising:
   forming a first mandrel mask pattern including a first structure and a second structure, each structure having a line portion and a flag portion, wherein the first and second structures are arranged on a first layer such that the line portions are adjacent and run parallel to each other and the flag portions of the first and second structures are oppositely disposed and overlap an end of the line portion of the other structure;
   transferring the first mandrel mask pattern to the first layer;
   forming first spacers on the first mandrel pattern and removing the first mandrel pattern from between the first spacers;
   transferring a pattern formed by the first spacers to a second layer to form a second mandrel pattern;
   forming second spacers on the second mandrel pattern and removing the second mandrel pattern from between the second spacers; and
   transferring a pattern formed by the second spacers to a third layer to form sub-lithographic conductive lines and contact landing segments in that third layer.

2. The method as recited in claim 1, further comprising trimming the first mandrel mask pattern to reduce its size.

3. The method as recited in claim 2, wherein forming second spacers includes forming mask structures to augment the second spacers to increase a dimension to form augmented regions.

4. The method as recited in claim 3, wherein the mask structures include a photoresist.

5. The method as recited in claim 3, further comprising removing portions of the augmented regions by a polishing process.

6. The method as recited in claim 1, wherein transferring a pattern formed by the second spacers to a third layer to form sub-lithographic conductive lines and contact landing segments in that third layer includes transferring the pattern within a width of a dimension four times a minimum feature size (F) achievable by lithography.

7. The method as recited in claim 1, wherein the first mandrel mask pattern includes a photoresist.

8. The method as recited in claim 1, wherein the steps of forming first spacers includes forming mask structures to augment the first spacers to increase a dimension of the first spacers to form augmented (widened) regions.

9. The method as recited in claim 8, further comprising removing a portion of the augmented regions by a polishing process.

10. The method as recited in claim 8, wherein the mask structures include a photoresist.

11. A method for fabricating integrated circuits, comprising:

forming a mandrel mask pattern including a first structure and a second structure, each structure having a line portion and a flag portion, wherein the first and second structures are arranged on a first layer such that the line portions are adjacent and run parallel to each other and the flag portions of the first and second structures are oppositely disposed and overlap an end of the line portion of the other structure;

transferring the mandrel mask pattern to the first layer;

forming spacers on the mandrel pattern and removing the mandrel pattern from between the spacers;

forming mask structures to augment the spacers to increase a dimension of subsequent mandrels; and repeating the steps of transferring the mandrel mask pattern, forming spacers, removing the mandrel pattern from between the spacers and forming mask structures until a number and size of sub-lithographic conductive lines and contact landing segments are formed.

12. The method as recited in claim 11, further comprising removing portions of the augmented regions by a polishing process.

13. The method as recited in claim 11, wherein the mask structures include a photoresist.

\* \* \* \* \*